(12) United States Patent
Schweinfurth et al.

(10) Patent No.: US 11,655,262 B2
(45) Date of Patent: May 23, 2023

(54) PROCESS FOR THE GENERATION OF METAL-CONTAINING FILMS

(71) Applicants: BASF SE, Ludwigshafen am Rhein (DE); Wayne State University, Detroit, MI (US)

(72) Inventors: David Dominique Schweinfurth, Ludwigshafen (DE); Lukas Mayr, Ludwigshafen (DE); Sinja Verena Klenk, Ludwigshafen (DE); Sabine Weiguny, Ludwigshafen (DE); Charles Hartger Winter, Detroit, MI (US); Kyle Blakeney, Detroit, MI (US); Nilanka Weerathunga Sirikkathuge, Detroit, MI (US); Tharindu Malawara Arachchige Nimanthaka Karunaratne, Detroit, MI (US)

( * ) Notice: Subject to any disclaimer, the term of this patent is extended or adjusted under 35 U.S.C. 154(b) by 0 days.

(21) Appl. No.: 17/710,178

(22) Filed: Mar. 31, 2022

(65) Prior Publication Data
US 2022/0220131 A1 Jul. 14, 2022

Related U.S. Application Data

(63) Continuation of application No. 16/954,341, filed as application No. PCT/EP2018/075053 on Sep. 17, 2018, now Pat. No. 11,319,332.
(Continued)

(51) Int. Cl.
*C07F 5/06* (2006.01)
*C23C 16/08* (2006.01)
(Continued)

(52) U.S. Cl.
CPC .............. *C07F 5/069* (2013.01); *C07F 5/067* (2013.01); *C23C 16/08* (2013.01); *C23C 16/12* (2013.01);
(Continued)

(58) Field of Classification Search
CPC ........... C07F 5/069; C07F 5/067; C23C 16/20
See application file for complete search history.

(56) References Cited

U.S. PATENT DOCUMENTS 3,892,607 A 7/1975 Eversteijn et al.
6,307,716 B1 10/2001 Hamaguchi et al.
(Continued)

FOREIGN PATENT DOCUMENTS

EP 0987270 B1 11/2002
EP 1788116 A1 5/2007
(Continued)

OTHER PUBLICATIONS

B. Luo et al., 37 Dalton Transactions, 4491-4498 (2006) (Year: 2006).*
(Continued)

*Primary Examiner* — Alexander R Pagano
(74) *Attorney, Agent, or Firm* — Armstrong Teasdale LLP

(57) ABSTRACT

A process including bringing a solid substrate in contact with a compound of general formula (I), (II), (III), or (IV) in the gaseous state

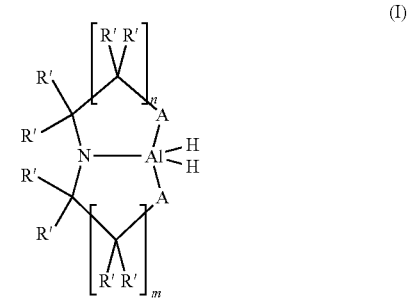
(I)

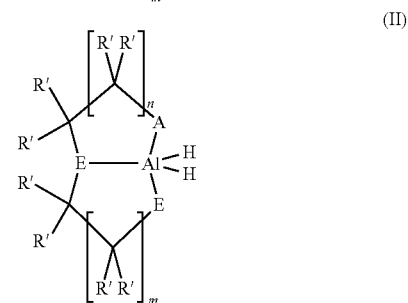

(II)

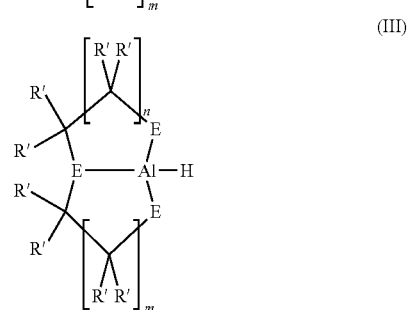

(III)

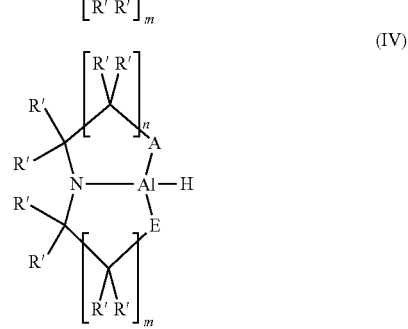

(IV)

(Continued)

where A is $NR_2$ or OR with R being an alkyl group, an alkenyl group, an aryl group, or a silyl group,
E is NR or O,
n is 0, 1 or 2, m is 0, 1 or 2, and
R' is hydrogen, an alkyl group, an alkenyl group, an aryl group, or a silyl group.

1 Claim, No Drawings

Related U.S. Application Data

(60) Provisional application No. 62/763,136, filed on Mar. 7, 2018, provisional application No. 62/763,125, filed on Dec. 20, 2017.

(51) Int. Cl.
*C23C 16/20* (2006.01)
*C23C 16/455* (2006.01)
*C23C 16/12* (2006.01)

(52) U.S. Cl.
CPC ........ *C23C 16/20* (2013.01); *C23C 16/45534* (2013.01); *C23C 16/45553* (2013.01)

(56) References Cited

U.S. PATENT DOCUMENTS

| | | | |
|---|---|---|---|
| 6,380,383 | B1 | 4/2002 | Shin |
| 9,580,799 | B2* | 2/2017 | Anthis .............. C23C 16/45553 |
| 11,319,332 | B2* | 5/2022 | Schweinfurth ......... C23C 16/12 |
| 11,505,562 | B2* | 11/2022 | Mayr ................ C23C 16/45534 |
| 2009/0136684 | A1 | 5/2009 | Peters et al. |
| 2009/0226612 | A1 | 9/2009 | Ogawa et al. |
| 2010/0204500 | A1 | 8/2010 | Clark et al. |
| 2013/0247972 | A1 | 9/2013 | Mungekar et al. |
| 2015/0004314 | A1 | 1/2015 | Winter et al. |
| 2015/0266904 | A1 | 9/2015 | Yoshino et al. |
| 2016/0348243 | A1* | 12/2016 | Xu .......................... C07F 3/003 |

FOREIGN PATENT DOCUMENTS

| | | |
|---|---|---|
| EP | 3121309 A1 | 5/2017 |
| JP | 2003034868 A | 2/2003 |
| WO | 2007136186 A1 | 11/2007 |
| WO | 2013070702 A1 | 5/2013 |

OTHER PUBLICATIONS

S. Trepanier et al., 13 Organometallics, 2213-2217 (1994) (Year: 1994).*

H. Sussek et al., 602 Journal of Organometallic Chemistry, 29-36 (2000) (Year: 2000).*
Y. Lien et al., 49 Inorganic Chemistry, 136-143 (2010) (Year: 2010).*
R. Less et al., 43 Dalton Transactions, 5785-5792 (2014) (Year: 2014).*
H. Choi et al., 10 Chem. Mater., 2323-2325 (1998) (Year: 1998).*
J. Chang et al., 20 Organometallics, 4445-4447 (2001) (Year: 2001).*
Emig, et al., "Neutral and Cationic Tetracoordinated Aluminum Complexes Featuring Tridentate Nitrogen Donors: Synthesis, Structure, and Catalytic Activity for the Ring-Opening Polymerization of Propylene Oxide and (d,l)-Lactide", Drganometallics, vol. 17, Issue 16, Jul. 15, 1998, pp. 3599-3608.
Lien, et al., "A New Type of Asymmetric Tridentate Pyrrolyl-Linked Pincer Ligand and Its Aluminum Dihydride Complexes", Inorganic Chemistry, vol. 49, Issue 1, Jan. 4, 2010, pp. 136-143.
Luo, et al., "Hydrido and chloro gallium and aluminium complexes with the tridentate bis(2-dimethylaminoethyl)amide ligand", Dalton Transactions, Issue 37, 2006, pp. 4491-4498.
Yang, et al., "Direct-liquid-evaporation chemical vapor deposition of smooth, highly conformal cobalt and cobalt nitride thin films", Journal of Materials Chemistry C, vol. 3, Issue 46, Nov. 3, 2015, pp. 12098-12106.
International Search Report and Written Opinion for corresponding PCT/EP2018/075053 dated Jan. 4, 2019, 9 pages.
Less, et al. "Reactivity and catalytic activity of tert-butoxyaluminium hydride reagents". Dalton Trans., 2014, 43, 5785-5792.
Tamami et al. "Association of Nucleobase-Containing Ammonium Ionenes". Macromolecular Chemistry and Physics, 2014, 215, 2337-2344.
Di Vaira et al. "Crystal and Molecular Structure of Dichlorobis(2-dimethylaminoethyl)methylaminecobalt(II)". Inorganic Chemistry, vol. 8, No. 12, Dec. 1969, pp. 2729-2734.
Barhacs et al. "Kinetics and mechanism of the stoichiometric oxygenation of [CuII(fla)(idpa)](ClO4[fla=flavonolate,idpa=3,3-imino-bis(N,N-dimethylpropylamine)] and the[CuII(fla)(idpa)]ClO4-catalysed oxygenation of flavonol". Inorganica Chimica Acta 320 (2001) 83-91.
Schmidt et al. "Metal-organic chemical vapor deposition of aluminum oxide thin films via pyrolysis of Jimethylaluminum isopropoxide". J. Vac. Sci. Technol. A 28(2), Mar./Apr. 2010, 238-243.
Marulanda-Arevalo et al. "Aluminum coating by fluidized bed chemical vapor deposition on austenitic stainless steels AISI 304 and AISI 316". Dyna 82 (189) p. 22-29, Feb. 2015.
HARRIS. "Preparation and Infrared Properties of Aluminum Oxide Films". Journal of the Optical Society of America, vol. 45, No. 1, Jan. 1955, p. 27-29.

* cited by examiner

PROCESS FOR THE GENERATION OF METAL-CONTAINING FILMS

CROSS-REFERENCE TO RELATED APPLICATIONS

This application is a continuation of U.S. patent application Ser. No. 16/954,341, filed Jun. 16, 2020, which is a U.S. National Phase Application of PCT/EP2018/075053, filed Sep. 17, 2018, which claims the benefit of priority to U.S. Provisional Patent Application 62/763,136, filed Mar. 7, 2018 and which claims the benefit of priority to U.S. Provisional Patent Application 62/763,125, filed Dec. 20, 2017, the entire contents of both of which are hereby incorporated by reference herein.

The present invention is in the field of processes for the generation of inorganic metal-containing films on substrates, in particular atomic layer deposition processes.

With the ongoing miniaturization, e.g. in the semiconductor industry, the need for thin inorganic films on substrates increases while the requirements on the quality of such films become stricter. Thin metal films serve different purposes such as barrier layers, conducting features, or capping layers. Several methods for the generation of metal films are known. One of them is the deposition of film forming compounds from the gaseous state on a substrate. In order to bring metal atoms into the gaseous state at moderate temperatures, it is necessary to provide volatile precursors, e.g. by complexation of the metals with suitable ligands. These precursors need to be sufficiently stable for evaporation, but on the other hand they need to be reactive enough to react with the surface of deposition.

EP 3 121 309 A1 discloses a process for depositing aluminum nitride films from tris(dialkylamino)aluminum precursors. However, the precursor is not stable enough for applications which require high quality films.

In order to convert deposited metal complexes to metal films, it is usually necessary to expose the deposited metal complex to a reducing agent. Typically, hydrogen gas is used to convert deposited metal complexes to metal films. While hydrogen works reasonably well as reducing agent for relatively noble metals like copper or silver, it does not yield satisfactory results for more electropositive metals such as titanium or aluminum.

WO 2013/070 702 A1 discloses a process for depositing metal films employing aluminum hydride which is coordinated by a diamine as reducing agent. While this reducing agent generally yields good results, for some demanding applications, higher vapor pressures, stability and/or reduction potential is required.

It was therefore an object of the present invention to provide a process for preparing inorganic metal-containing films having less impurity in the film. The process materials should be easy to handle; in particular, it should be possible to vaporize them with as little decomposition as possible. Further, the process material should not decompose at the deposition surface under process conditions but at the same time it should have enough reactivity to participate in the surface reaction. All reaction by-products should be volatile to avoid film contamination. In addition, it should be possible to adjust the process such that metal atoms in the process material are either volatile or are incorporated in the film. Furthermore, the process should be versatile, so it can be applied to produce a broad range of different metals including electropositive metal films.

These objects were achieved by a process for preparing inorganic metal-containing films comprising bringing a solid substrate in contact with a compound of general formula (I), (II), (III), or (IV) in the gaseous state

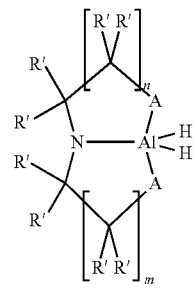

(I)

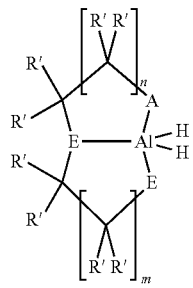

(II)

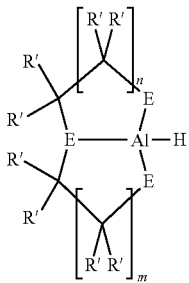

(III)

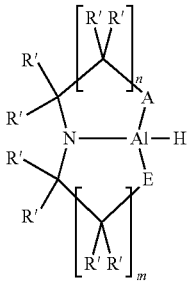

(IV)

wherein A is $NR_2$ or OR with R being an alkyl group, an alkenyl group, an aryl group, or a silyl group, E is NR or O, n is 0, 1 or 2, m is 0, 1 or 2, and R' is hydrogen, an alkyl group, an alkenyl group, an aryl group, or a silyl group.

Preferred embodiments of the present invention can be found in the description and the claims. Combinations of different embodiments fall within the scope of the present invention.

The process according to the present invention is suitable for preparing inorganic metal-containing films. Inorganic in the context of the present invention refers to materials which contain at least 5 wt.-% of at least one metal or semimetal, preferably at least 10 wt.-%, more preferably at least 20 wt.-%, in particular at least 30 wt.-%. Inorganic films typically contain carbon only in the form of a carbide phase including mixed carbide phases such as nitride carbide phases. The carbon content of carbon which is not part of a carbide phase in an inorganic film is preferably less than 5 wt.-%, more preferable less than 1 wt.-%, in particular less than 0.2 wt.-%. Preferred examples of inorganic metal-containing films are metal nitride films, metal carbide films, metal carbonitride films, metal alloy films, intermetallic compound films or films containing mixtures thereof.

The film prepared by the process according to the present invention contains metal. It is possible that the film contains one metal or more than one metal. Metals include Li, Be, Na, Mg, Al, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os Ir, Pt, Au, Hg, Tl, Pb, Bi. As the process according to the present invention is versatile with regard to the metal, the metal can be more electropositive than Cu, more preferably more electropositive than Ni. In particular, the metal-containing compound contains Ti, Ta, Mn, Mo, W, Al, Co, Ga, Ge, Sb, or Te.

The solid substrate can be any solid material. These include for example metals, semimetals, oxides, nitrides, and polymers. It is also possible that the substrate is a mixture of different materials. Examples for metals are aluminum, steel, zinc, and copper. Examples for semimetals are silicon, germanium, and gallium arsenide. Examples for oxides are silicon dioxide, titanium dioxide, and zinc oxide. Examples for nitrides are silicon nitride, aluminum nitride, titanium nitride, and gallium nitride. Examples for polymers are polyethylene terephthalate (PET), polyethylene naphthalene-dicarboxylic acid (PEN), and polyamides.

The solid substrate can have any shape. These include sheet plates, films, fibers, particles of various sizes, and substrates with trenches or other indentations. The solid substrate can be of any size. If the solid substrate has a particle shape, the size of particles can range from below 100 nm to several centimeters, preferably from 1 µm to 1 mm. In order to avoid particles or fibers to stick to each other while the metal-containing compound is deposited onto them, it is preferably to keep them in motion. This can, for example, be achieved by stirring, by rotating drums, or by fluidized bed techniques.

According to the present invention the solid substrate is brought in contact with a compound of general formula (I), (II), (III), or (IV) in the gaseous phase. R' in the compound of general formula (I), (II), (III), or (IV) is hydrogen, an alkyl group, an alkenyl group, an aryl group, or a silyl group, preferably hydrogen. The R' can be the same or different to each other. Preferably, all R' are hydrogen.

An alkyl group can be linear or branched. Examples for a linear alkyl group are methyl, ethyl, n-propyl, n-butyl, n-pentyl, n-hexyl, n-heptyl, n-octyl, n-nonyl, n-decyl. Examples for a branched alkyl group are iso-propyl, iso-butyl, sec-butyl, tert-butyl, 2-methyl-pentyl, neo-pentyl, 2-ethylhexyl, cyclopropyl, cyclohexyl, indanyl, norbornyl. Preferably, the alkyl group is a $C_1$ to $C_8$ alkyl group, more preferably a $C_1$ to $C_6$ alkyl group, in particular a $C_1$ to $C_4$ alkyl group, such as methyl, ethyl, iso-propyl or tert-butyl.

An alkenyl group contains at least one carbon-carbon double bond. The double bond can include the carbon atom with which R' is bound to the rest of the molecule, or it can be placed further away from the place where R' is bound to the rest of the molecule. Alkenyl groups can be linear or branched. Examples for linear alkenyl groups in which the double bond includes the carbon atom with which R' is bound to the rest of the molecule include 1-ethenyl, 1-propenyl, 1-n-butenyl, 1-n-pentenyl, 1-n-hexenyl, 1-n-heptenyl, 1-n-octenyl. Examples for linear alkenyl groups in which the double bond is placed further away from the place where R' is bound to the rest of the molecule include 1-n-propen-3-yl, 2-buten-1-yl, 1-buten-3-yl, 1-buten-4-yl, 1-hexen-6-yl. Examples for branched alkenyl groups in which the double bond includes the carbon atom with which R' is bound to the rest of the molecule include 1-propen-2-yl, 1-n-buten-2-yl, 2-buten-2-yl, cyclopenten-1-yl, cyclohexen-1-yl. Examples for branched alkenyl groups in which the double bond is placed further away from the place where R' is bound to the rest of the molecule include 2-methyl-1-buten-4-yl, cyclopenten-3-yl, cyclohexene-3-yl. Examples for an alkenyl group with more than one double bonds include 1,3-butadien-1-yl, 1,3-butadien-2-yl, cylopentadien-5-yl.

Aryl groups include aromatic hydrocarbons such as phenyl, naphthalyl, anthrancenyl, phenanthrenyl groups and heteroaromatic groups such as pyrryl, furanyl, thienyl, pyridinyl, quinoyl, benzofuryl, benzothiophenyl, thienothienyl. Several of these groups or combinations of these groups are also possible like biphenyl, thienophenyl or furanylthienyl. Aryl groups can be substituted for example by halogens like fluoride, chloride, bromide, iodide; by pseudohalogens like cyanide, cyanate, thiocyanate; by alcohols; alkyl chains or alkoxy chains. Aromatic hydrocarbons are preferred, phenyl is more preferred.

A silyl group is a silicon atom with typically three substituents. Preferably a silyl group has the formula $SiX_3$, wherein X is independent of each other hydrogen, an alkyl group, an aryl group or a silyl group. It is possible that all three X are the same or that two A are the same and the remaining X is different or that all three X are different to each other, preferably all X are the same. Alkyl and aryl groups are as described above. Examples for silyl groups include $SiH_3$, methylsilyl, trimethylsilyl, triethylsilyl, tri-n-propylsilyl, tri-iso-propylsilyl, tricyclohexylsilyl, dimethyl-tert-butylsilyl, dimethylcyclohexylsilyl, methyl-di-iso-propylsilyl, triphenylsilyl, phenylsilyl, dimethylphenylsilyl, pentamethyldisilyl.

A in the compound of general formula (I), (II), (III), or (IV) is $NR_2$ or OR, i.e. a nitrogen atom bearing two substituents R or an oxygen atom bearing one substituent R. R is an alkyl group, an alkenyl group, an aryl group, or a silyl group. The same definitions and preferred embodiments apply as for R' described above unless expressly described differently. Preferably, R is methyl, ethyl, tert-butyl or trimethylsilyl. Also preferably, if A is $NR_2$ two R form together a five-membered ring including the nitrogen atom, in particular the two R are a —$CH_2$—$CH_2$—$CH_2$—$CH_2$— group in the five-membered ring including the nitrogen atom.

E in the compound of general formula (II) or (III) is NR or O, i.e. a nitrogen atom bearing one substituent R or an oxygen atom. The definition for R is the same as for R in A.

The variable n can be 0, 1 or 2, the variable m can be 0, 1 or 2, preferably, n+m is 1, 2, 3 or 4, more preferably, n is 1 or 2 and m is 1 or 2, even more preferably, n is 1 and m is 1 or n is 2 and m is 2.

It is possible that all R' and R are separate substituents. Alternatively, it is possible that two R' or two R or an R' and an R together form a ring, preferably a four to eight-membered ring, in particular a five- or six-membered ring.

In the compound of general formula (I), n and m can be 1 such that the compound of general formula (I) becomes one of the following general formulae.

(Ia)
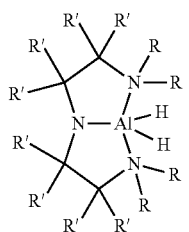
(Ib)
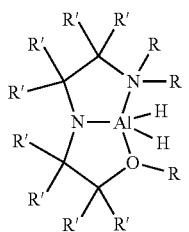
(Ic)
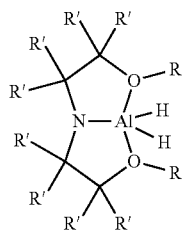
Preferred examples for the compound of general formula (Ia), (Ib), and (Ic) are shown below.
(Ia-1)
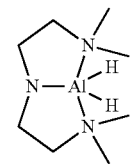
(Ia-2)
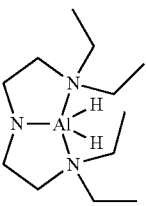
(Ia-3)
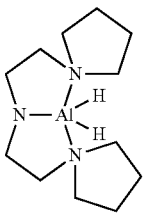
(Ib-1)
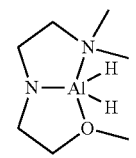
(Ib-2)
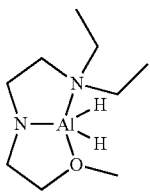
(Ib-3)
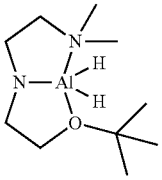
(Ib-4)
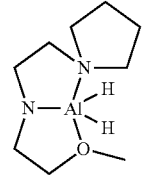
(Ic-1)
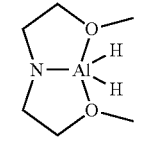
(Ic-2)
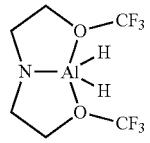
(Ic-3)
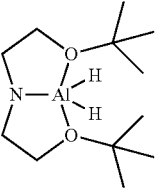
(Ic-4)
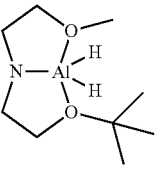
(Ic-5)
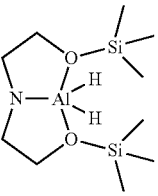
Some preferred examples of the compound of general formula (Ia) in which two R' form a ring together are shown below.

(Ia-11)
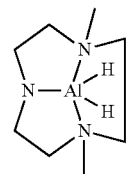
(Ia-12)
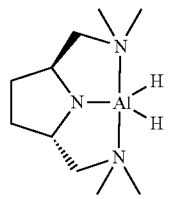
(Ia-13)
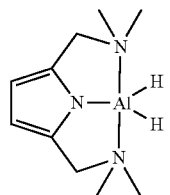
In the compound of general formula (I), n can be 2 and m can be 1 such that the compound of general formula (I) becomes one of the following general formulae.
(Id)
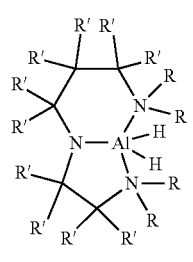
(Ie)
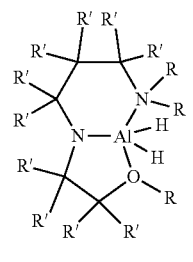
(If)
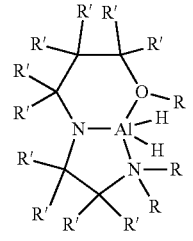
(Ig)
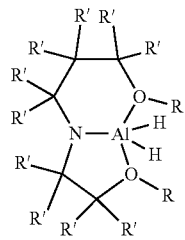
Preferred examples for the compound of general formula (Id), (Ie), (If) and (Ig) are shown below.
(Id-1)
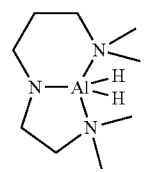
(Id-2)
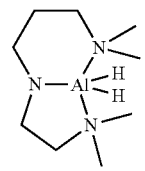
(Ie-1)
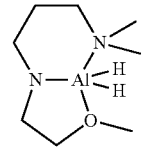
(Ie-2)
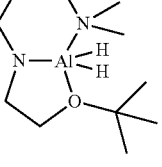
(If-1)
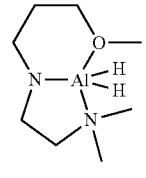
(If-2)
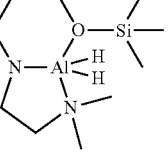
(Ig-1)
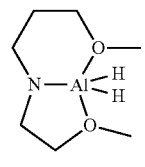

(Ig-2)
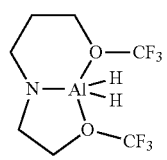
In the compound of general formula (I), n and m can be 2 such that the compound of general formula (I) becomes one of the following general formulae.
(Ih)
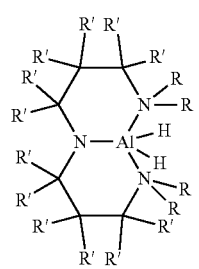
(Ii)
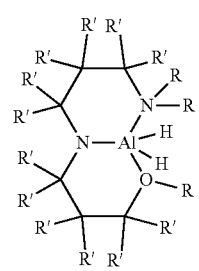
(Ij)
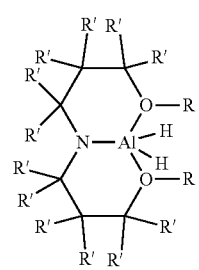
Preferred examples for the compound of general formula (Ih), (Ii), and (Ij) are shown below.
(Ih-1)
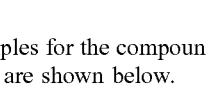
(Ih-2)
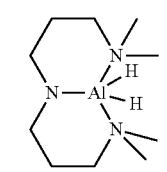
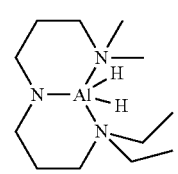
(Ih-3)
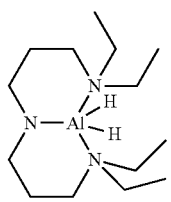
(Ih-4)
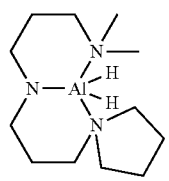
(Ih-5)
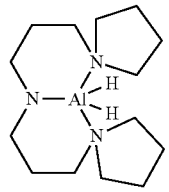
(Ii-1)
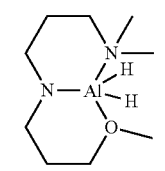
(Ii-2)
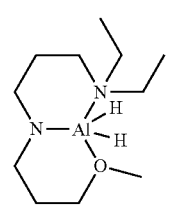
(Ih-3)
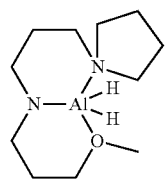
(Ih-4)
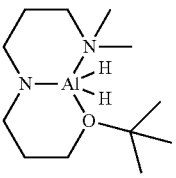
(Ij-1)
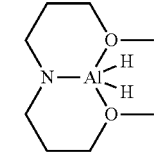

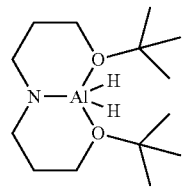 (Ij-2)

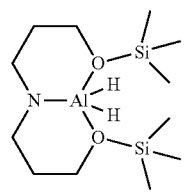 (Ij-3)

In the compound of general formula (I), n can be 0 and m can be 1 such that the compound of general formula (I) becomes general formula (Ik).

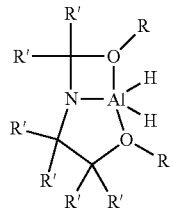 (Ik)

A preferred example of the compound of general formula (Ik) is shown below.

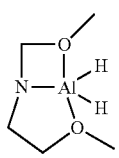 (Ik-1)

In the compound of general formula (II), n and m can be 1 such that the compound of general formula (II) becomes one of the following general formulae.

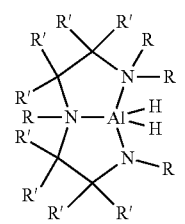 (IIaa)

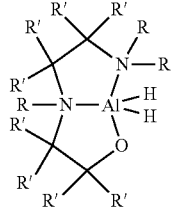 (IIab)

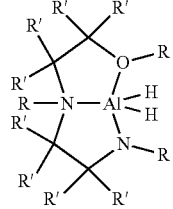 (IIac)

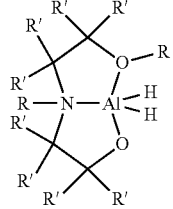 (IIad)

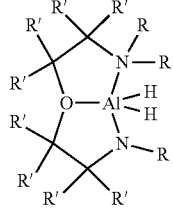 (IIae)

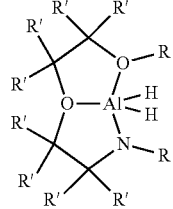 (IIaf)

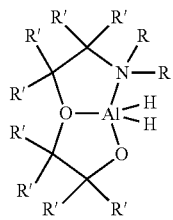 (IIag)

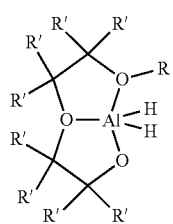 (IIah)

Preferred examples for the compound of general formula (IIaa) to (IIah) are shown below.
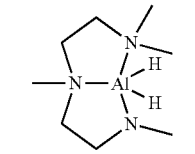
(IIaa-1)
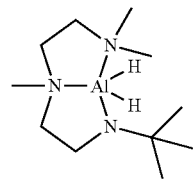
(IIaa-2)
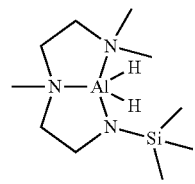
(IIaa-3)
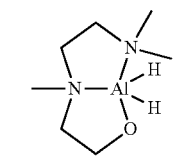
(IIab-1)
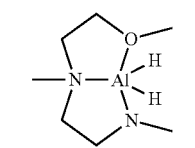
(IIac-1)
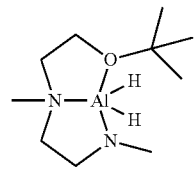
(IIac-2)
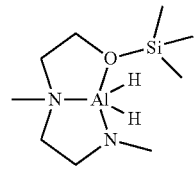
(IIac-3)
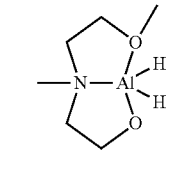
(IIad-1)
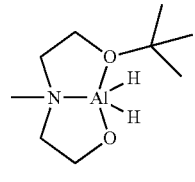
(IIad-2)
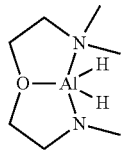
(IIae-1)
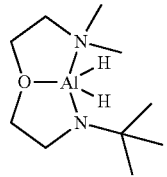
(IIae-2)
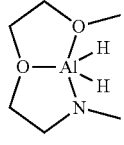
(IIaf-1)
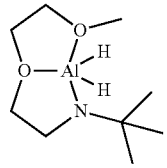
(IIaf-2)
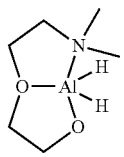
(IIag-1)
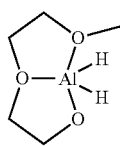
(IIah-1)
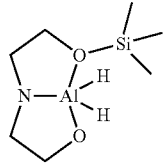
(IIah-2)
In the compound of general formula (II), n can be 2 and m can be 1 such that the compound of general formula (II) becomes one of the following general formulae.
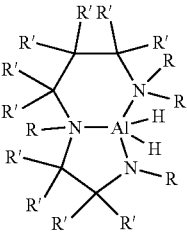
(IIba)

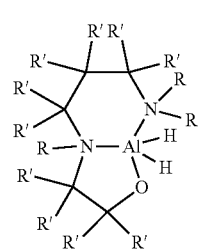 (IIbb)
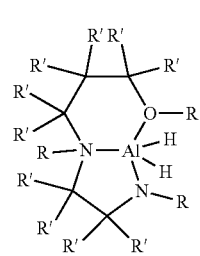 (IIbc)
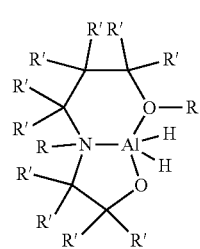 (IIbd)
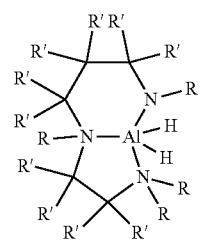 (IIbe)
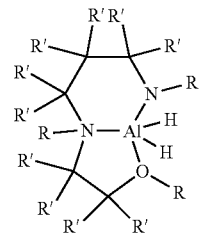 (IIbf)
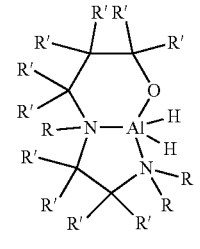 (IIbg)
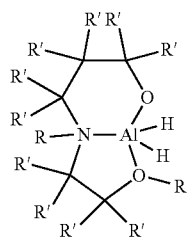 (IIbh)
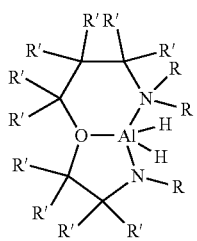 (IIbi)
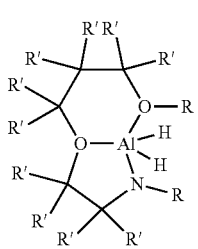 (IIbj)
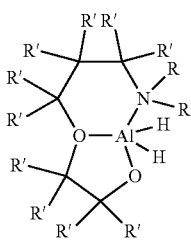 (IIbk)
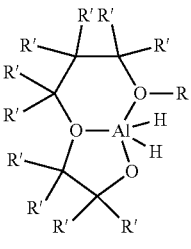 (IIbm)
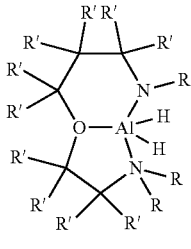 (IIbn)

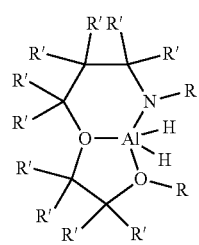
(IIbo)
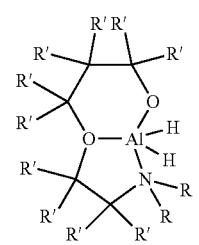
(IIbq)
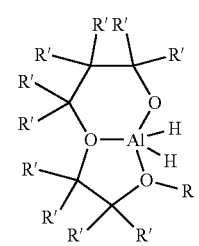
(IIbr)
Preferred examples for the compound of general formula (IIba) to (IIbr) are shown below.
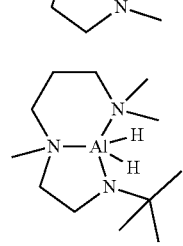
(IIba-1)
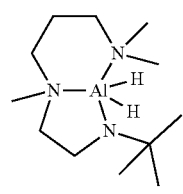
(IIba-2)
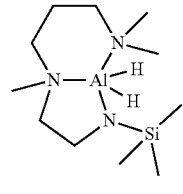
(IIba-3)
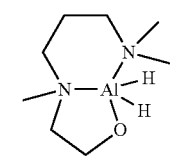
(IIbb-1)
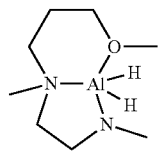
(IIbc-1)
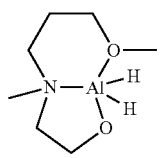
(IIbd-1)
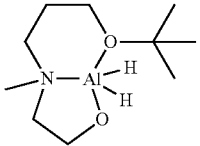
(IIbd-2)
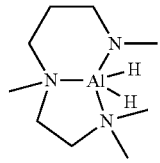
(IIbe-1)
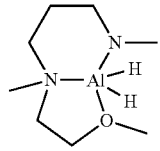
(IIbf-1)
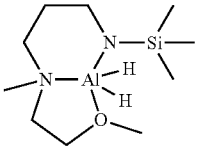
(IIbf-2)
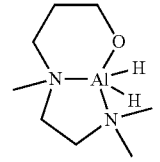
(IIbg-1)
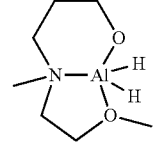
(IIbh-1)
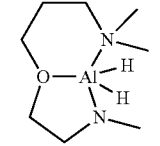
(IIbi-1)

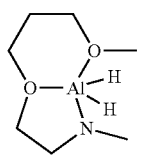
(IIbj-1)
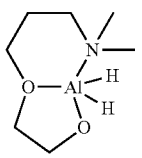
(IIbk-1)
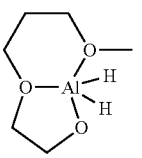
(IIbm-1)
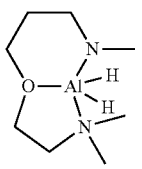
(IIbn-1)
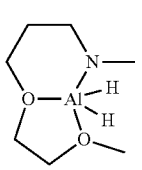
(IIbo-1)
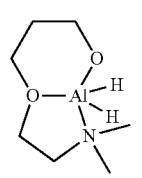
(IIbq-1)
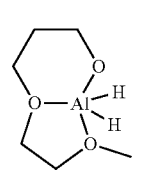
(IIbr-1)
In the compound of general formula (I), n and m can be 2 such that the compound of general formula (I) becomes one of the following general formulae.
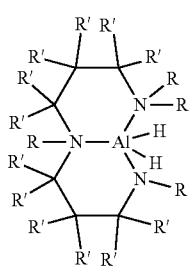
(IIca)
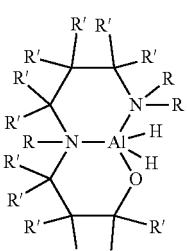
(IIcb)
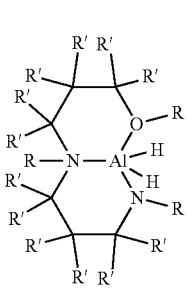
(IIcc)
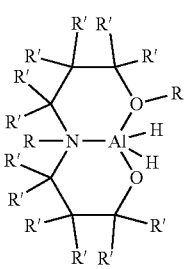
(IIcd)
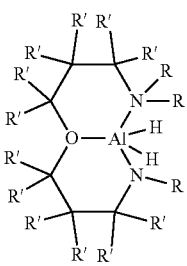
(IIce)
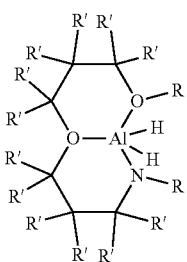
(IIcf)
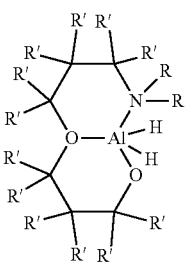
(IIcg)

-continued
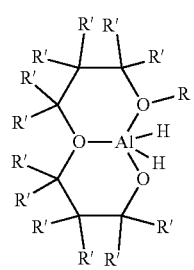
(IIch)
Preferred examples for the compound of general formula (IIca) to (IIch) are shown below.
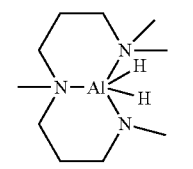
(IIca-1)
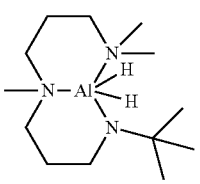
(IIca-1)
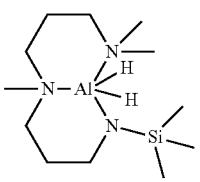
(IIca-1)
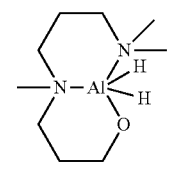
(IIcb-1)
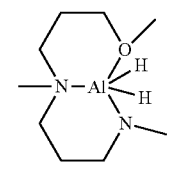
(IIcc-1)
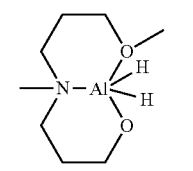
(IIcd-1)
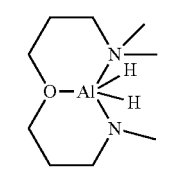
(IIce-1)
-continued
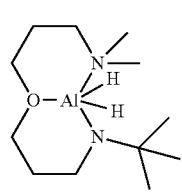
(IIce-1)
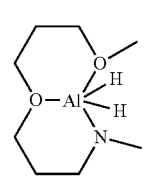
(IIcf-1)
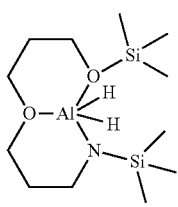
(IIcf-1)
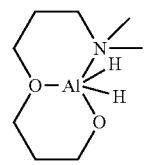
(IIce-1)
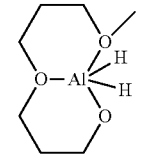
(IIch-1)
In the compound of general formula (II), n can be 0 and m can be 1 or 2 such that the compound of general formula (II) becomes one of the following general formulae.
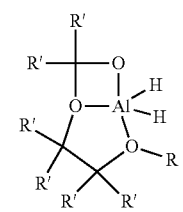
(IIda)
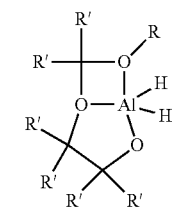
(IIdb)

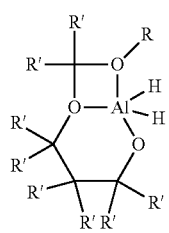
(IIdc)

Preferred examples for the compound of general formula (IIda) to (IIdc) are shown below.

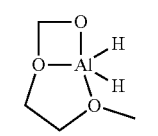
(IIda-1)

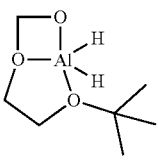
(IIda-2)

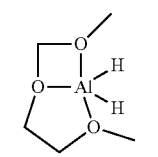
(IIdb-1)

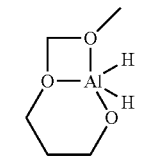
(IIdc-1)

In the compound of general formula (III), n and m can be 1 such that the compound of general formula (III) becomes one of the following general formulae.

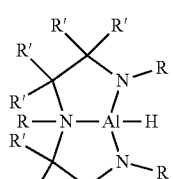
(IIIa)

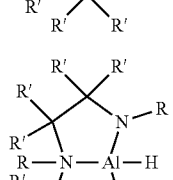
(IIIb)

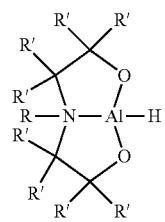
(IIIc)

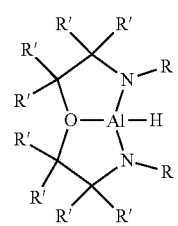
(IIId)

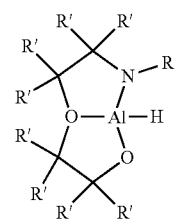
(IIIe)

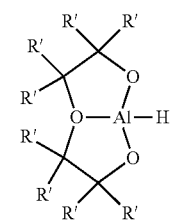
(IIIf)

Preferred examples for the compound of general formula (IIIa) to (IIIf) are shown below.

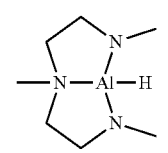
(IIIa-1)

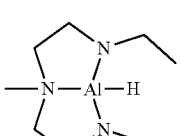
(IIIa-2)

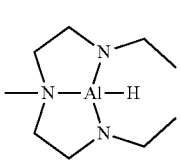
(IIIa-3)

(IIIa-4) 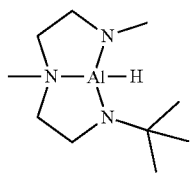
(IIIa-5) 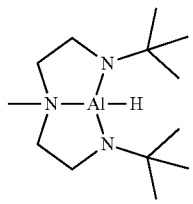
(IIIa-6) 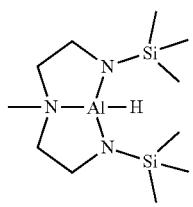
(IIIb-1) 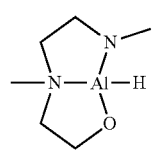
(IIIc-1) 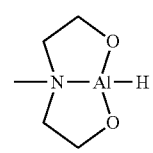
(IIId-1) 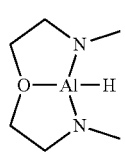
(IIId-2) 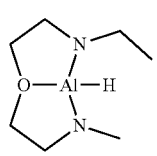
(IIId-3) 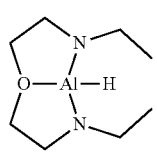
(IIId-4) 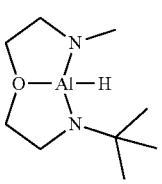
(IIId-5) 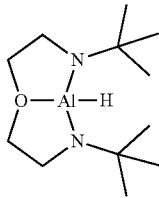
(IIId-6) 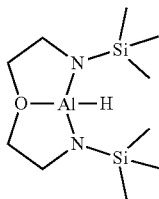
(IIIe-1) 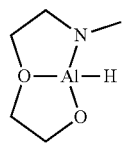
(IIIf-1) 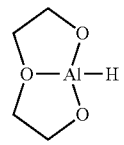
In the compound of general formula (III), n can be 2 and m can be 1 such that the compound of general formula (III) becomes one of the following general formulae.
(IIIg) 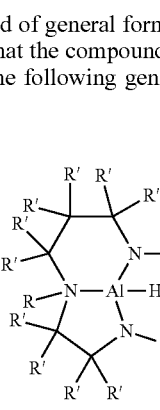
(IIIh) 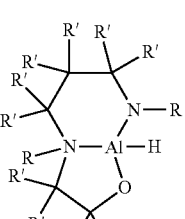
(IIIi) 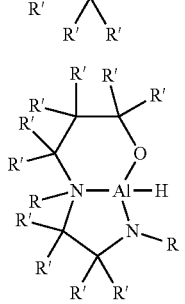

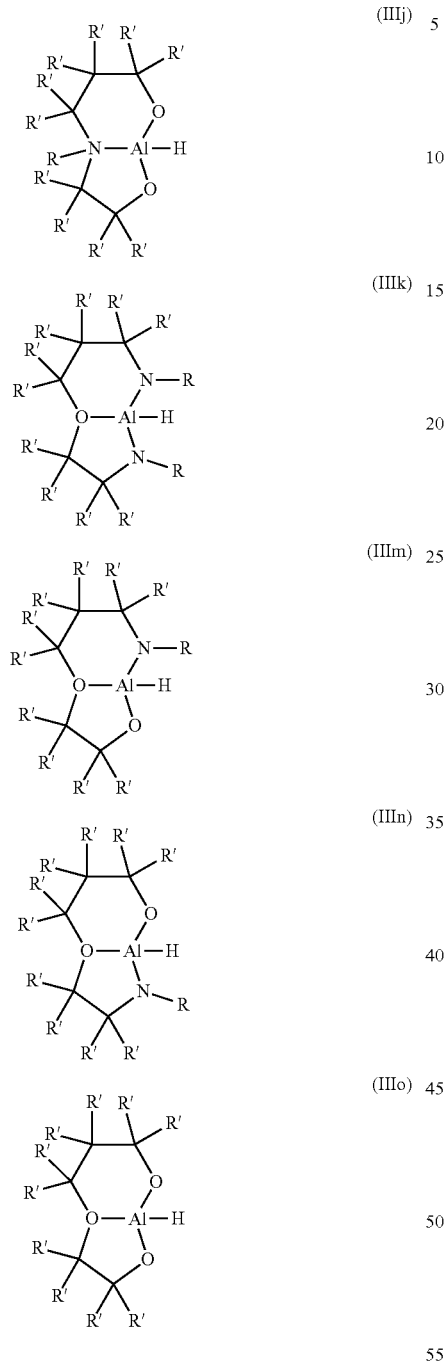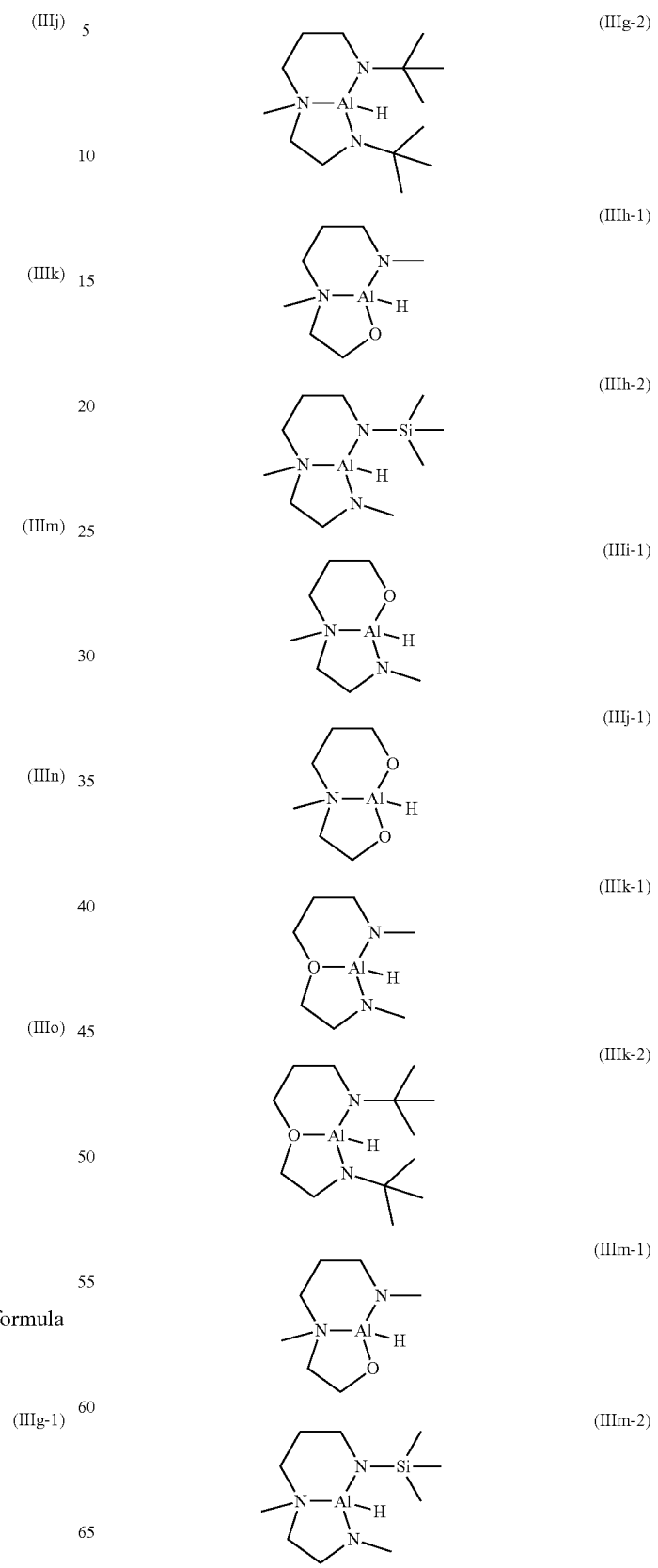
Preferred examples for the compound of general formula (IIIa) to (IIIo) are shown below.

(IIIn-1)
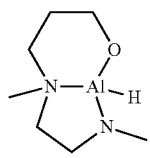
(IIIo-1)
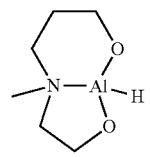
In the compound of general formula (III), n and m can be 2 such that the compound of general formula (III) becomes one of the following general formulae.
(IIIp)
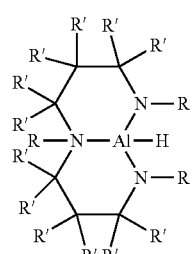
(IIIq)
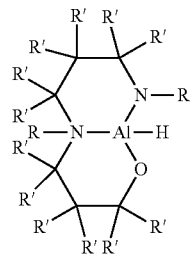
(IIIr)
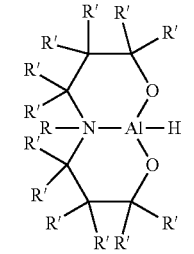
(IIIs)
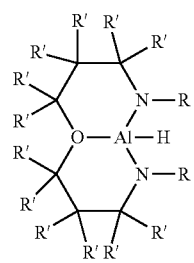
(IIIt)
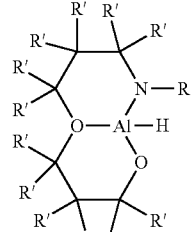
(IIIu)
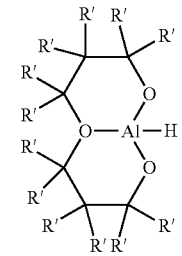
Preferred examples for the compound of general formula (IIIp) to (IIIu) are shown below.
(IIIp-1)
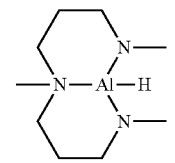
(IIIp-2)
(IIIp-3)
(IIIp-4)
(IIIp-5)

(IIIq-1) 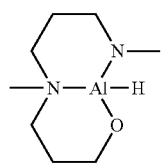
(IIIr-1) 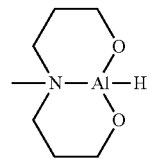
(IIIs-1) 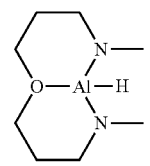
(IIIs-2) 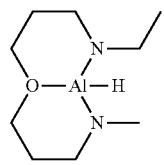
(IIIs-3) 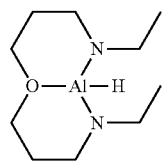
(IIIs-4) 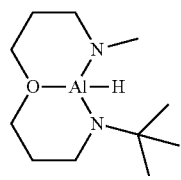
(IIIs-5) 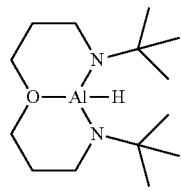
(IIIs-6) 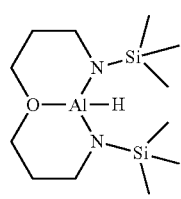
(IIIt-1) 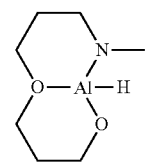
(IIIt-2) 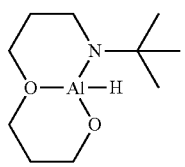
(IIIu-1) 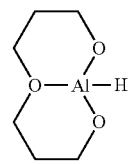
In the compound of general formula (III), n can be 0 and m can be 1 such that the compound of general formula (III) becomes general formula (IIIv).
(IIIv) 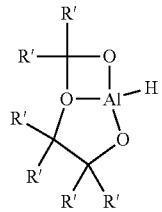
In the compound of general formula (IV), n and m can be 1 such that the compound of general formula (IV) becomes one of the following general formulae.
(IVa) 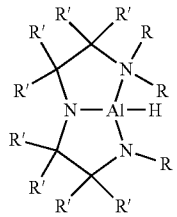
(IVb) 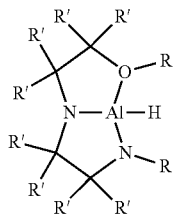
(IVc) 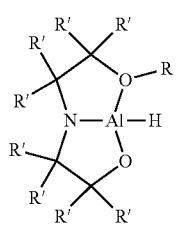

(IVd)
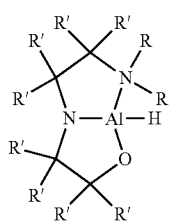
Preferred examples for the compound of general formula (IVa) to (IVd) are shown below.
(IVa-1)
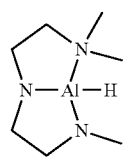
(IVa-2)
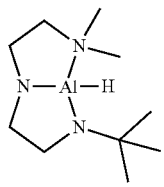
(IVa-3)
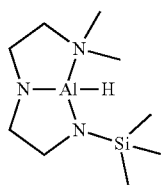
(IVb-1)
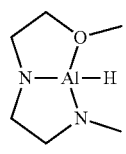
(IVb-2)
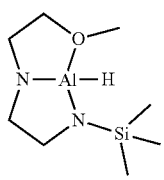
(IVc-1)
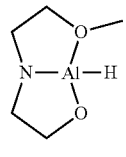
(Ivc-1)
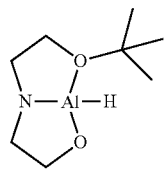
(Ivd-1)
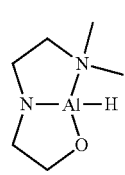
In the compound of general formula (IV), n can be 2 and m can be 1 such that the compound of general formula (IV) becomes one of the following general formulae.
(IVe)
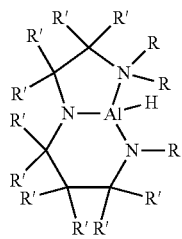
(IVf)
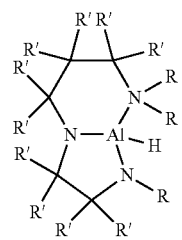
(IVg)
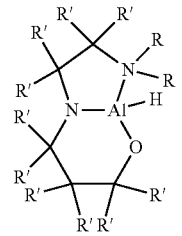
(IVh)
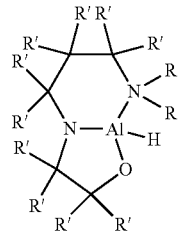
(IVi)
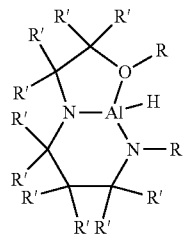

(IVj)
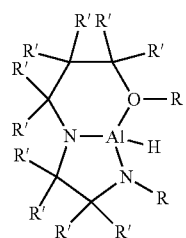
(IVk)
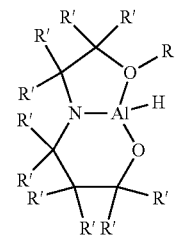
(IVm)
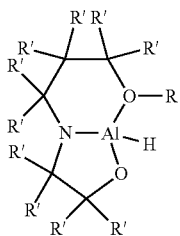
Preferred examples for the compound of general formula (IVe) to (IVm) are shown below.
(IVe-1)
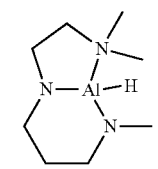
(IVe-1)
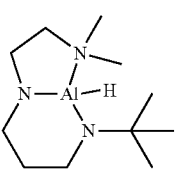
(IVf-1)
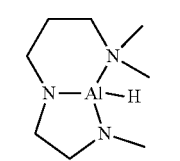
(IVf-1)
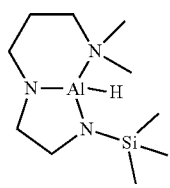
(IVg-1)
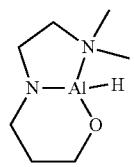
(IVh-1)
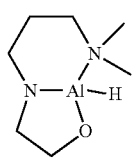
(IVi-1)
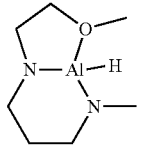
(IVi-2)
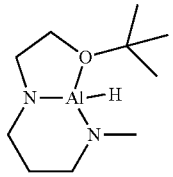
(IVj-1)
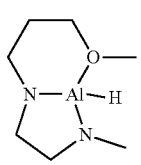
(IVj-1)
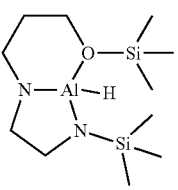
(IVk-1)
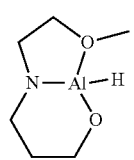

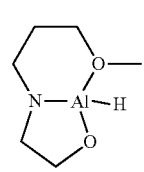
(IVm-1)
In the compound of general formula (IV), n and m can be 2 such that the compound of general formula (IV) becomes one of the following general formulae.
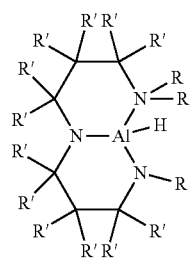
(IVn)
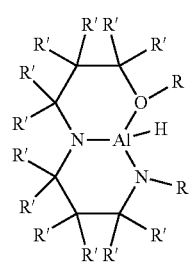
(IVo)
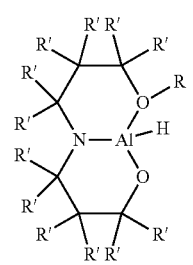
(IVp)
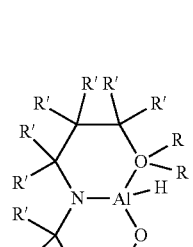
(IVq)
Preferred examples for the compound of general formula (IVn) to (IVo) are shown below.
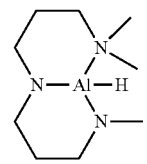
(IVn-1)
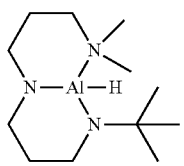
(IVn-2)
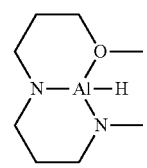
(IVo-1)
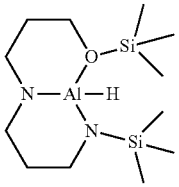
(IVo-2)
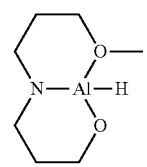
(IVn-1)
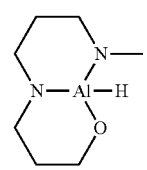
(IVn-2)
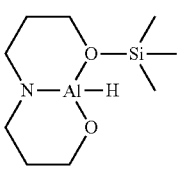
(IVo-1)
(IVo-2)

In the compound of general formula (IV), n can be 0 and m can be 2 such that the compound of general formula (IV) becomes general formula (IVr).

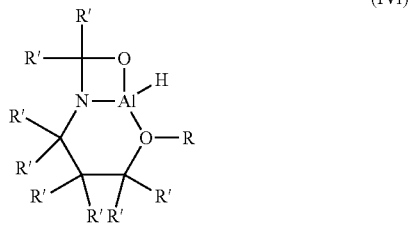

(IVr)

A preferred example of the compound of general formula (IVr) is shown below.

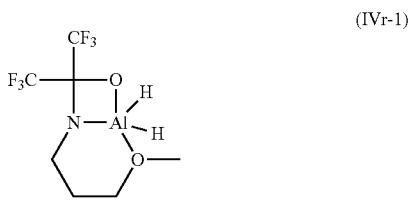

(IVr-1)

Preferably, if E is NR or A is OR, R in NR or OR bears no hydrogen atom in the 1-position, i.e. R bears no hydrogen atom which is bonded to the atom which is bonded to the nitrogen or oxygen atom, which is thus in the beta-position with regard to the aluminum atom. Examples are alkyl group bearing two alkyl side groups in the 1-position, i.e. 1,1-dialkylalkyl, such as tert-butyl, 1,1-dimethylpropyl; alkyl groups with two halogens in the 1-position such as trifluoromethyl, trichloromethyl, 1,1-difluoroethyl; trialkylsilyl groups such as trimethylsilyl, triethylsilyl, dimethyltert-butylsilyl; aryl groups, in particular phenyl or alkyl-substituted phenyl such as 2,6-diisopropylphenyl, 2,4,6-triisopropylphenyl. Alkyl groups bearing no hydrogen atom in the 1-position are particularly preferred.

The compound of general formula (I), (II), (III), or (IV) preferably has a molecular weight of not more than 1000 g/mol, more preferably not more than 800 g/mol, even more preferably not more than 600 g/mol, in particular not more than 500 g/mol.

Preferably, the compound of general formula (I), (II), (III), or (IV) has a melting point ranging from −80 to 125° C., preferably from −60 to 80° C., even more preferably from −40 to 50° C., in particular from −20 to 20° C. It is advantageous if the compound of general formula (I), (II), (III), or (IV) melts to give a clear liquid which remains unchanged until a decomposition temperature.

Preferably, the compound of general formula (I), (II), (III), or (IV) has a decomposition temperature of at least 80° C., more preferably at least 100° C., in particular at least 120° C., such as at least 150° C. Often, the decomposition temperature is not more than 250° C. The compound of general formula (I), (II), (III), or (IV) has a high vapor pressure. Preferably, the vapor pressure is at least 1 mbar at a temperature of 200° C., more preferably at 150° C., in particular at 120° C. Usually, the temperature at which the vapor pressure is 1 mbar is at least 50° C.

The compound of general formula (I), (II), (III), or (IV) can be synthesized by reacting the organic ligand with LiAlH$_4$ or a mixture of AlCl$_3$ and LiAlH$_4$ as for example disclosed by N. Emig et al. in Organometallics, volume 17 (1998), pages 3599-3608 or by B. Luo et al. in Dalton Transactions, volume (2006), pages 4491-4498.

Ligands including their synthesis are disclosed for the compound of general formula (Ia) and (IIaa) by Luitjes et al. in Synthetic Communications, volume 24 (1994), pages 2257-2261, for (Ib), (Ie), (If), and (IVk) in EP 1 642 880 A1, for (Ic) by Behloul et al. in Synthesis, volume 8 (2004), pages 1274-1280 for (Id) in U.S. Pat. No. 6,299,676, for (Ih) by Lin et al. in Catalysis Communication, volume 111 (2018), pages 64-69, for (Ii) by Hauser et al. in the Journal of the American Chemical Society, volume 68 (1946), pages 1544-1546, for (Ij) by Utermohlen et al. in the Journal of the American Chemical Society, volume 67 (1945), page 1505, for (Ik) Knier et al. in the Journal of the American Chemical Society, volume 22 (1980), pages 6789-6798, for (IIab) by Doege et al. in Pharmazie, volume 62 (2007), pages 174-178, for (IIac) in EP 3 216 786 A1, for (IIad) by Kuethe et al. in Organic Letters, volume 5 (2003), pages 3975-3978, for (IIae) in EP 1 505 059 A1, for (IIaf) by Heathcote et al. in Dalton Transactions, volume 13 (2007), pages 1309-1315, for (IIag) by Rattay in Pharmazie, volume 52 (1997), pages 676-679, for (IIbb) and (IIcb) by Felfoldi et al. in Acta Physica et Chemica, volume 26 (1980), pages 163-169, for (IIbd) in WO 2013/060 944, for (IIIi) by Schloegl et al. in Monatshefte for Chemie, volume 95 (1964), pages 922-941, for (IIbk) by Lovett et al. in the Journal of Organic Chemistry, volume 56 (1991), pages 2755-2758, for (IIbr) by Okano et al, in Chemistry Letters, 1982, pages 977-980, for (IIch) by Dale et al. in Acta Chemica Scandinavica, volume 46 (1992), pages 278-282, for (IIda) Grunwald et al. in the Journal of the American Chemical Society, volume 107 (1985), pages 4710-4715, for (IIdb) Bartels et al. in European Journal of Inorganic Chemistry, volume 10 (2002), pages 2569-2586, for (IIdc) Bertini et al. in Heterocycles, volume 41 (1995), pages 675-688, for (IIIa) by Tuladhar et al. in Tetrahedron Letters, volume 33 (1992), pages 2203-2206, for (IIIb) by Yamamoto et al in Chemistry Letters, volume 52 (2013), pages 1559-1561, for (IIIc) by Ge et al. in RSC Advances, volume 4 (2014), pages 43195-43203, for (IIId) by Yoshino et al. in Chemical Communications, volume 16 (2000), pages 1475-1476, for (IIIe) by Oku et al. in the Journal of the American Chemical Society, volume 126 (2004), pages 7368-7377, for (IIIf) by Jadhav et al. in Tetrahedron Letters, volume 53 (2012), pages 5338-5342, for (IIIh) and (IIIq) by Jiang et al. in the Journal of Medicinal Chemistry, volume 54 (2011), pages 320-330, for (IIIj) and (IIIr) by Powel et al. in Synthesis, volume 4 (1984), pages 338-340, for (IIIo) by Hassannia et al. in Letters in Organic Chemistry, volume 6 (2009), pages 478-480, for (IIIu) by Buchanan et al. in the Canadian Journal of Chemistry, volume 78 (2000), pages 3163-321, for (IIv) Balashov et al. in Russian Journal of Physical Chemistry, volume 71 (1997), pages 1016-1019, for (IVc) by Lazarus et al. in Journal of the Chemical Society, Perkin Transactions 2: Physical Organic Chemistry, 1980, page 373-379, for (IVd) by Nakajima et al. in Bulletin of the Chemical Society of Japan, volume 34 (1961), pages 651-654, for (IVg) in DE2553137, for (IVh) by Korshunov et al. in Zhurnal Organicheskoi Khimii, volume 11 (1969), page 1947-1952, for (IVr) in GB1178420.

The compound of general formula (I), (II), (III), or (IV) used in the process according to the present invention are used at high purity to achieve the best results. High purity means that the substance used contains at least 90 wt.-% metal-containing compound or compound of general formula (I), (II), (III), or (IV), preferably at least 95 wt.-%, more preferably at least 98 wt.-%, in particular at least 99 wt.-%. The purity can be determined by elemental analysis according to DIN 51721 (Prufung fester Brennstoffe-Bestimmung des Gehaltes an Kohlenstoff und Wasserstoff-Verfahren nach Radmacher-Hoverath, August 2001).

The compound of general formula (I), (II), (III), or (IV) is brought in contact with the solid substrate from the gaseous state. It can be brought into the gaseous state for example by heating them to elevated temperatures. In any case a temperature below the decomposition temperature of the compound of general formula (I), (II), (III), or (IV) has to be chosen. The decomposition temperature is the temperature at which the pristine compound of general formula (I), (II), (III), or (IV) begins changing its chemical structure and composition. Preferably, the heating temperature ranges from 0° C. to 300° C., more preferably from 10° C. to 250° C., even more preferably from 20° C. to 200° C., in particular from 30° C. to 150° C.

Another way of bringing the compound of general formula (I), (II), (III), or (IV) into the gaseous state is direct liquid injection (DLI) as described for example in US 2009/0 226 612 A1. In this method the compound of general formula (I), (II), (III), or (IV) is typically dissolved in a solvent and sprayed in a carrier gas or vacuum. If the vapor pressure of the compound of general formula (I), (II), (III), or (IV) and the temperature are sufficiently high and the pressure is sufficiently low the compound of general formula (I), (II), (III), or (IV) is brought into the gaseous state. Various solvents can be used provided that the compound of general formula (I), (II), (III), or (IV) shows sufficient solubility in that solvent such as at least 1 g/l, preferably at least 10 g/l, more preferably at least 100 g/l. Examples for these solvents are coordinating solvents such as tetrahydrofuran, dioxane, diethoxyethane, pyridine or non-coordinating solvents such as hexane, heptane, benzene, toluene, or xylene. Solvent mixtures are also suitable.

Alternatively, the compound of general formula (I), (II), (III), or (IV) can be brought into the gaseous state by direct liquid evaporation (DLE) as described for example by J. Yang et al. (Journal of Materials Chemistry, 2015). In this method the compound of general formula (I), (II), (III), or (IV) is mixed with a solvent, for example a hydrocarbon such as tetradecane, and heated below the boiling point of the solvent. By evaporation of the solvent, the compound of general formula (I), (II), (III), or (IV) is brought into the gaseous state. This method has the advantage that no particulate contaminants are formed on the surface.

It is preferred to bring the compound of general formula (I), (II), (III), or (IV) into the gaseous state at decreased pressure. In this way, the process can usually be performed at lower heating temperatures leading to decreased decomposition of the compound of general formula (I), (II), (III), or (IV). It is also possible to use increased pressure to push the compound of general formula (I), (II), (III), or (IV) in the gaseous state towards the solid substrate. Often, an inert gas, such as nitrogen or argon, is used as carrier gas for this purpose. Preferably, the pressure is 10 bar to 10-7 mbar, more preferably 1 bar to $10^3$ mbar, in particular 1 to 0.01 mbar, such as 0.1 mbar.

Preferably, the compound of general formula (I), (II), (III), or (IV) acts as reducing agent in the process. In this case, a metal-containing compound is deposited from the gaseous state onto the solid substrate before bringing it in contact with a compound of general formula (I), (II), (III), or (IV). The metal-containing compound is usually reduced to a metal, a metal nitride, a metal carbide, a metal carbonitride, a metal alloy, an intermetallic compound or mixtures thereof. Metal films in the context of the present invention are metal-containing films with high electrical conductivity, usually at least $10^4$ S/m, preferably at least $10^5$ S/m, in particular at least $10^6$ S/m.

The compound of general formula (I), (II), (III), or (IV) has a low tendency to form a permanent bond with the surface of the solid substrate with the deposited metal-containing compound. As a result, the metal-containing film hardly gets contaminated with the reaction by-products of the compound of general formula (I), (II), (III), or (IV). Preferably, the metal-containing film contains in sum less than 5 weight-% nitrogen, more preferably less than 1 wt.-%, in particular less than 0.5 wt.-%, such as less than 0.2 wt.-%.

The metal-containing compound contains at least one metal atom. Metals include Li, Be, Na, Mg, Al, K, Ca, Sc, Ti, V, Cr, Mn, Fe, Co, Ni, Cu, Zn, Ga, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os Ir, Pt, Au, Hg, Tl, Pb, Bi. As the process according to the present invention is very versatile with regard to the metal-containing compound, the metal-containing compound can contain a metal which is more electropositive than Cu, more preferably more electropositive than Ni. In particular, the metal-containing compound contains Ti, Ta, Mn, Mo, W, Al, Co, Ge, Ga, Sb, or Te. It is possible that more than one metal-containing compound is deposited on the surface, either simultaneously or consecutively. If more than one metal-containing compound is deposited on a solid substrate it is possible that all metal-containing compounds contain the same metal or different ones, preferably they contain different metals.

Any metal-containing compound, which can be brought into the gaseous state, is suitable. These compounds include metal alkyls such as dimethyl zinc, trimethylaluminum; metal alkoxylates such as tetramethoxy silicon, tetra-iso-propoxy zirconium or tetra-iso-propoxy titanium; metal cyclopentadienyl complexes like pentamethylcyclopendienyl-trimethoxy titanium or di(ethylcycopentadienyl) manganese; metal carbenes such as tris(neopentyl)neopentyl-idene tantalum or bisimidazolidinyliden ruthenium chloride; metal halides such as aluminum trichloride, tantalum pentachloride, titanium tetrachloride, molybdenum pentachloride, or tungsten hexachloride; carbon monoxide complexes like hexacarbonyl chromium or tetracarbonyl nickel; amine-derived complexes such as bis(tert-butylimino)bis(dimethylamido)molybdenum, bis(tertbutylimino)bis(dimethylamido)tungsten or tetrakis(dimethylamido)titanium; diketonate complexes such as tris(acetylacetonato)aluminum or bis(2,2,6,6-tetramethyl-3,5-heptanedionato) manganese.

Further examples for metal-containing compounds are aluminum tris(2,2,6,6-tetramethyl-3,5-heptanedionate), tri-isobutylaluminum, trimethylaluminum, tris(dimethylamido) aluminum(III), triethylgallium, trimethylgallium, tris(dimethylamido)gallium(III), tetrakis(diethylamido)titanium (IV), tetrakis(dimethylamido)titanium(IV), tetrakis (ethylmethylamido)titanium(IV), titanium (IV) diisopropoxidebis(2,2,6,6-tetramethyl-3,5-heptanedionate), titanium(IV) isopropoxide, titanium tetrachloride, bis(cyclopentadienyl)vanadium(II), bis(ethylcyclopentadienyl)vanadium(II), vanadium(V) oxytriisopropoxide, bis(cyclopentadienyl)chromium(II), bis(pentamethylcyclopentadienyl) chromium(II), chromium(III) tris(2,2,6,6-tetramethyl-3,5-heptanedionate), copper bis(6,6,7,7,8,8-heptafluoror-2,2-dimethyl-3,5-octanedionate), copper bis(2,2,6,6-tetramethyl-3,5-heptanedionate), bis (pentamethylcyclopentadienyl)manganese(II), bromopentacarbonylmanganese(I), cyclopentadienylmanganese(I) tricarbonyl, ethylcyclopentadienylmanagenese(I) tricarbonyl, managnese(0) carbonyl, [1,1'-bis(diphenylphosphino)ferrocene]tetracarbonylmolybdenum(0), bis(pentamethylcyclopentadienyl)iron(II), 1,1'-diethylferrocene, iron(II) tris(2,2,6,6-tetramethyl-3,5-heptanedionate), iron(0) pentacarbonyl, bis(cyclopentadienyl)cobalt(II), bis(ethylcyclopentadienyl)cobalt(II), bis(pentamethylcyclopentadienyl)cobalt(II), allyl(cyclopentadienyl)nickel(II), bis(cyclopentadienyl)nickel (II), bis(ethylcyclopentadienyl)nickel(II), bis(triphenylphosphine)nickel(II) dichloride, nickel(II) bis(2,2,6,6-tetramethyl-3,5-heptanedionate), tris[N,N-bis(trimethylsilyl)amide]yttrium, tris(butylcyclopentadienyl)yttrium(III), tris(cyclopentadienyl)yttrium(II), yttrium(III) tris(isopropoxide), yttrium(III) tris(2,2,6,6-tetramethyl-3,5-heptanedionate), bis(cyclopentadienyl)niobium(IV) dichloride, bis(cyclopentadienyl)zirconium(IV) dihydride, dimethylbis(pentamethylcyclopentadienyl)zirconium(IV), tetrakis(diethylamido)zirconium(IV), tetrakis(dimethylamido)zirconium(IV), tetrakis(ethylmethylamido)zirconium(IV), zirconium(IV) 2-ethylhexanoate, zirconium tetrakis(2,2,6,6-tetramethyl-3,5-heptanedionate), bis(tertbutylcyclopentadienyl) dimethylhafnium(IV), bis(trimethylsilyl)amidohafnium(IV) chloride, dimethylbis(cyclopentadienyl)hafnium(IV), hafnium(IV) tert-butoxide, tetrakis(diethylamido)hafnium(IV), tetrakis(dimethylamido)hafnium(IV), tetrakis(etmhylmethylamido)hafnium(IV), pentakis(dimethylamino)tantalum(V), tantalum(V) ethoxide, tris(diethylamido)(tert-butylimido)tantalum(V), bis(butylcyclopentadienyl)tungsten(IV) diiodide, bis(tert-butylimino)bis(terbutylamino) tungsten, bis(tert-butylimino)bis(dimethylamino)tungsten(VI), bis(cyclopentadienyl)tungsten(IV) dichloride, bis(cyclopentadienyl)tungsten(IV) dihydride, bis(isopropylcyclopentadienyl)tungsten(IV) dihydride, cyclopentadienyltungsten(II) tricarbonyl hydride, tetracarbonyl(1,5-cyclooctadiene)tungsten(0), and triamminetungsten(IV) tricarbonyl, tungsten hexacarbonyl, bis(pentafluorophenyl)zinc, bis(2,2,6,6-tetramethyl-3,5-heptanedionato)zinc(II), diethylzinc, diphenylzinc, trimethyl(methylcyclopentadienyl)platinum(IV), triethyl(methylcyclopentadienyl)platinum(IV), bis(cyclopentadienyl)magnesium(II), bis(pentamethylcyclopentadienyl)magnesium, (3-aminopropyl)triethoxysilane, N-sec-butyl(trimethylsilyl)amine, chloropentamethyldisilane, 1,2-dichlorotetramethyldisilane, 1,3-diethyl-1,1,3,3-tetarmethyldisilazane, 1,2-dimethyl-1,1,2,2-tetraphenyldisilane, dodecamethylcyclohexasilane, hexamethyldisilane, hexamethyldisilazane, methylsilane, 2,4,6,8,10-pentamethylcyclopentasiloxane, pentamethyldisilane, silicon tetrabromide, silicon tetrachloride, tetraethylsilane, 2,4,6,8-tetramethylcyclotetrasiloxane, 1,1,2,2-tetramethyldisilane, tris(tert-butoxy)silanol, tris(tert-pentoxy)silanol, germanium(IV) fluoride, hexamethyldigermanium(IV), hexaphenyldigermanium(IV), tetramethylgermanium, tributylgermanium hydride, triphenylgermanium hydride, bis[bis(trimethylsilyl)amino]tin(II), dibutyldiphenyltin, hexaphenylditin(IV), tetraallyltin, tetrakis(diethylamido)tin(IV), tetrakis(dimethylamido)tin(IV), tetramethyltin, tetravinyltin, tin(II) acetylactonate, trimethyl(phenylethylnyl)tin, and trimethyl(phenyl)tin, tri(ethyloxy)antimony(III), tri(butyloxy)antimony(II), $((CH_3)_2N)_3SbGe(OC_2H_5)_4$, tetramethylgermanium(IV), tetraethylgermanium(IV), tetra-n-butylgermanium(IV).

Metal halides are preferred, metal chlorides are more preferred, in particular $TiCl_4$, $TaCl_5$, $MoCl_5$, $WCl_5$, $WCl_6$, $AlCl_3$, $GaCl_3$, $GeCl_4$, $TeCl_4$. It is preferred that the molecular weight of the metal-containing compound is up to 1000 g/mol, more preferred up to 800 g/mol, in particular up to 600 g/mol, such as up to 500 g/mol.

The process is preferably performed as atomic layer deposition (ALD) process comprising the sequence (a) depositing a metal-containing compound from the gaseous state onto a solid substrate and (b) bringing the solid substrate with the deposited metal-containing compound in contact with a compound of general formula (I), (II), (III), or (IV). Preferably, the sequence comprising (a) and (b) is performed at least twice, more preferably at least five times, even more preferably at least 10 times, in particular at least 50 times. Often, the sequence comprising (a) and (b) is performed not more than 1000 times.

Generally, it is preferred to purge the substrate and its surrounding apparatus with an inert gas each time the solid substrate is exposed to the metal-containing compound or the compound of general formula (I), (II), (III), or (IV) in the gaseous state. Preferred examples for inert gases are nitrogen and argon. Purging can take 1 s to 1 min, preferably 5 to 30 s, more preferably from 10 to 25 s, in particular 15 to 20 s.

Preferably, the temperature of the substrate is 5° C. to 40° C. higher than the place where the metal-containing compound is brought into the gaseous state, for example 20° C. Preferably, the temperature of the substrate is from room temperature to 400° C., more preferably from 100 to 300° C., such as 150 to 220° C.

Preferably, after deposition of a metal-containing compound on the solid substrate and before bringing the solid substrate with the deposited metal-containing compound in contact with the compound of general formula (I), (II), (III), or (IV), the solid substrate with the deposited metal-containing compound is brought in contact with an acid in the gaseous phase. Without being bound by a theory, it is believed that the protonation of the ligands of the metal-containing compound facilitates its decomposition and reduction. Suitable acids include hydrochloric acid and carboxylic acids, preferably, carboxylic acids such as formic acid, acetic acid, propionic acid, butyric acid, or trifluoroacetic acid, in particular formic acid.

An example for the process of the present invention is a method of depositing a metal-containing film on a substrate, comprising:

(i) supplying a metal precursor vapor to a substrate to obtain a coated substrate;

(ii) purging the coated substrate with a first carrier gas;

(iii) supplying an aluminum hydride co-reactant to the coated substrate; and then (iv) purging with a second carrier gas, wherein the aluminum hydride co-reactant is a metal complex, comprising an aluminum hydride comprising 1 to 3 hydrogen atoms bonded to aluminum, and wherein (i) to (iv) are optionally repeated one or more times. A metal precursor generally is a metal-containing compound. The aluminum hydride co-reactant is a compound of general formula (I), (II), (III), or (IV), preferably a compound of general formula (I), more preferably a compound of general formula (Ia), even more preferably a compound of general formula (Ia)

wherein R' is hydrogen, in particular a compound of general formula (Ia) wherein R' is hydrogen and R is methyl.

Alternatively, the process according to the present invention can serve to deposit aluminum from the compound of general formula (I), (II), (III), or (IV). In this case, the compound of general formula (I), (II), (III), or (IV) adsorbs to the surface of the solid substrate, for example because there are reactive groups such as OH groups on the surface of the solid substrate or the temperature of the solid substrate is sufficiently high. Preferably the adsorbed compound of general formula (I), (II), (III), or (IV) is decomposed.

The decomposition can be effected in various ways. The temperature of the solid substrate can be increased above the decomposition temperature. In this case, the process is a chemical vapor deposition (CVD) process. Typically, the solid substrate is heated to a temperature in the range of 300 to 1000° C., preferably in the range of 350 to 600° C.

Furthermore, it is possible to expose the deposited compound of general formula (I), (II), (III), or (IV) to a plasma like an oxygen plasma, hydrogen plasma, ammonia plasma, or nitrogen plasma; to oxidants like oxygen, oxygen radicals, ozone, nitrous oxide ($N_2O$), nitric oxide (NO), nitrogendioxde ($NO_2$) or hydrogenperoxide; to ammonia or ammonia derivatives for example tert-butylamine, iso-propylamine, dimethylamine, methylethylamine, or diethylamine; to hydrazine or hydrazine derivatives like N,N-dimethylhydrazine; to solvents like water, alkanes, or tetrachlorocarbon; or to boron compound like borane. The choice depends on the chemical structure of the desired layer. For aluminum oxide, it is preferable to use oxidants, plasma or water, in particular oxygen, water, oxygen plasma or ozone. For aluminum, nitride, ammonia, hydrazine, hydrazine derivatives, nitrogen plasma or ammonia plasma are preferred. For aluminum boride boron compounds are preferred. For aluminum carbide, alkanes or tetrachlorocarbon are preferred. For aluminum carbide nitride, mixtures including alkanes, tetrachlorocarbon, ammonia and/or hydrazine are preferred.

The process is preferably performed as atomic layer deposition (ALD) process comprising the sequence (c) bringing a solid substrate in contact with a compound of general formula (I), (II), (III), or (IV) and (d) decomposing the adsorbed compound of general formula (I), (II), (III), or (IV). Preferably, the sequence comprising (c) and (d) is performed at least twice, more preferably at least five times, even more preferably at least 10 times, in particular at least 50 times. Often, the sequence comprising (c) and (d) is performed not more than 1000 times.

In this case the temperature of the substrate is preferably 5° C. to 40° C. higher than the place where the metal-containing compound is brought into the gaseous state, for example 20° C. Preferably, the temperature of the substrate is from room temperature to 400° C., more preferably from 100 to 300° C., such as 150 to 220° C.

If the temperature of the substrate in the process according to the present invention is kept below the decomposition temperature of the metal-containing compound, typically a monolayer is deposited on the solid substrate. Once a molecule of the metal-containing compound is deposited on the solid substrate further deposition on top of it usually becomes less likely. Thus, the deposition of the metal-containing compound on the solid substrate preferably represents a self-limiting process step. The typical layer thickness of a self-limiting deposition processes step is from 0.01 to 1 nm, preferably from 0.02 to 0.5 nm, more preferably from 0.03 to 0.4 nm, in particular from 0.05 to 0.2 nm. The layer thickness is typically measured by ellipsometry as described in PAS 1022 DE (Referenzverfahren zur Bestimmung von optischen und dielektrischen Materialeigenschaften sowie der Schichtdicke dunner Schichten mittels Ellipsometrie; February 2004).

The exposure of the substrate with the compound of general formula (I), (II), (III), or (IV) or the metal-containing compound can take from milliseconds to several minutes, preferably from 0.1 second to 1 minute, in particular from 1 to 10 seconds. The longer the solid substrate at a temperature below the decomposition temperature of the compound of general formula (I), (II), (III), or (IV) or the metal-containing compound is exposed to the compound of general formula (I), (II), (III), or (IV) or the metal-containing compound the more regular films formed with less defects.

A particular advantage of the process according to the present invention is that the compound of general formula (I), (II), (III), or (IV) is very versatile, so the process parameters can be varied in a broad range. Therefore, the process according to the present invention includes both a CVD process as well as an ALD process.

The process according to the present invention yields an inorganic metal-containing film. A film can be only one monolayer of a metal or be thicker such as 0.1 nm to 1 μm, preferably 0.5 to 50 nm. A film can contain defects like holes. These defects, however, generally constitute less than half of the surface area covered by the film. The film preferably has a very uniform film thickness which means that the film thickness at different places on the substrate varies very little, usually less than 10%, preferably less than 5%. Furthermore, the film is preferably a conformal film on the surface of the substrate. Suitable methods to determine the film thickness and uniformity are XPS or ellipsometry.

The film obtained by the process according to the present invention can be used in an electronic element. Electronic elements can have structural features of various sizes, for example from 1 nm to 100 μm, for example 10 nm, 14 nm or 22 nm. The process for forming the films for the electronic elements is particularly well suited for very fine structures. Therefore, electronic elements with sizes below 1 μm are preferred. Examples for electronic elements are field-effect transistors (FET), solar cells, light emitting diodes, sensors, or capacitors. In optical devices such as light emitting diodes or light sensors the film obtained by the process according to the present invention serves to increase the refractive index of the layer which reflects light.

Preferred electronic elements are transistors. Preferably the film acts as chemical barrier metal in a transistor. A chemical barrier metal is a material which reduces diffusion of adjacent layers while maintaining electrical connectivity.

EXAMPLES

Example 1a: Synthesis of [2-(dimethylamino)ethyl](2-methoxyethyl)amine

A mixture of 2-chloroethyl methyl ether (6.092 g, 0.063 mol), N,N-dimethylethylenediamine (19.382 g, 0.213 mol), and water (5 mL) was refluxed for 18 h in a 250 mL round bottomed flask. Hexane (15 mL) and water (10 mL) were added to the resultant solution at ambient temperature. The flask contents were transferred to a separatory funnel. The aqueous fraction was washed with hexane (14×15 mL) and the combined organic fractions were dried over anhydrous $MgSO_4$. The solvent was evaporated under reduced pressure to yield an intense yellow oil (5.513 g, 59.8% yield).

$^1$H NMR (400 MHz, $C_6D_6$, δ in ppm): 2.04 (s, 6H), 2.29 (t, 2H), 2.60 (t, 2H), 2.71 (t, 2H), 3.09 (s, 3H), 3.32 (t, 2H).
$^1$H NMR (400 MHz, $C_6D_6$, δ in ppm):
$^{13}$C NMR (100 MHz, $C_6D_6$, δ in ppm): 45.91, 48.34, 50.35, 58.81, 60.08, 73.15.

Example 1 b: Synthesis of AlH$_2$[CH$_3$OCH$_2$CH$_2$NCH$_2$CH$_2$NMe$_2$] (Ib-1)

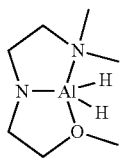

A solution of AlCl$_3$ (0.788 g, 5.9 mmol) in 30 mL of diethyl ether was cannulated into a stirred solution of LiAlH$_4$ (0.708 g, 17.7 mmol) in 30 mL of diethyl ether at 0° C. in an ice bath. The resultant cloudy solution was warmed to room temperature, stirred for 40 min and re-cooled to −30° C. Then, a solution of [2-(dimethylamino)ethyl](2-methoxyethyl)amine (3.458 g, 23.6 mmol) in 45 mL of diethyl ether was added dropwise. The resultant mixture was stirred at ambient temperature for 18 h and was then filtered through a 2-cm plug of Celite on a coarse glass frit. The diethyl ether was evaporated from the filtrate under reduced pressure to collect the intense yellow colored, oily product (2.745 g, 66.7% yield). The crude product was purified by distillation at 74° C. under reduced pressure affording a colorless oil (1.645 g, 40% yield).

$^1$H NMR (400 MHz, C$_6$D$_6$, δ in ppm): 2.12 (s, 6H), 2.33 (t, 2H), 2.90 (t, 2H), 3.03 (t, 3H), 3.20 (s, 3H), 3.37 (t, 2H).

$^{13}$C NMR (100 MHz, C$_6$D$_6$, δ in ppm): 45.51, 47.85, 49.29, 57.91, 60.73, 74.19. IR: $v_{AlH}$/cm$^{-1}$ 1764.

Example 2: Synthesis of H$_2$Al[N(CH$_2$CH$_2$CH$_2$NMe$_2$)$_2$] (Ih-1)

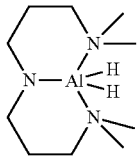

A solution of AlCl$_3$ (0.690 g, 5.2 mmol) in 40 mL of diethyl ether was cannulated into a stirred solution of LiAlH$_4$ (0.621 g, 15.5 mmol) in 40 mL of diethyl ether at 0° C. in an ice bath. The resulting cloudy solution was warmed to room temperature, stirred for 40 min, and then cooled to −30° C. At this point, a solution of 3,3'-iminobis(N,N-dimethyl-propylamine) (4.003 g, 20.7 mmol) in 55 mL of diethyl ether was added dropwise. The resultant mixture stirred at ambient temperature for 18 h and was then filtered through a 2-cm pad of Celite on a coarse glass frit. The diethyl ether was evaporated from the filtrate under reduced pressure to obtain a colorless, oily product (4.003 g, 91% yield). A portion of resultant product (2.043 g) was distilled at 65° C. under reduced pressure to afford a colorless oil (1.604 g, 79% yield).

$^1$H NMR (400 MHz, C$_6$D$_6$, δ in ppm): 1.51 (p, 4H), 2.17 (s, 12H), 2.36 (t, 4H), 3.25 (t, 4H).

$^{13}$C NMR (100 MHz, C$_6$D$_6$, δ in ppm): 28.61, 46.76, 57.77, 60.69. IR: $v_{AlH}$/cm$^{-1}$ 1691.

The invention claimed is:
1. A compound of formula (Ia-2)

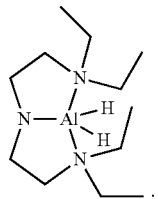

(Ia-2)

* * * * *